June 13, 1967 HISATO MURAKAMI 3,325,630

NUMERICAL CONTROL PULSE DISTRIBUTION SYSTEM

Filed May 20, 1960

5 Sheets-Sheet 1

G1, G3 = AND GATE CIRCUIT
G2 = OR GATE CIRCUIT
V1, V2 = AMPLIFIER CIRCUIT
DC = DELAY CIRCUIT
SC = SYNCHRONIZING CIRCUIT

G4 = AND CIRCUIT
ADD = ADDING CIRCUIT

FF2, FF3 = FLIP-FLOP CIRCUIT
G5 = AND GATE CIRCUIT

G6,7,8,9,14,15,16 = AND GATE CIRCUIT
G10,11,12,13,17 = OR GATE CIRCUIT
NOT 1,2,3,4 = INVERSION CIRCUIT
FF4 = FLIP-FLOP CIRCUIT
V3, V4 = AMPLIFIER CIRCUIT

FIG. 15
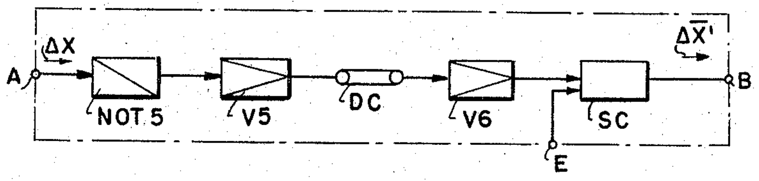
NOT 5 = INVERSION CIRCUIT
V5, V6 = AMPLIFIER CIRCUIT
DC = DELAY CIRCUIT
SC = SYNCHRONIZING CIRCUIT
FIG. 16
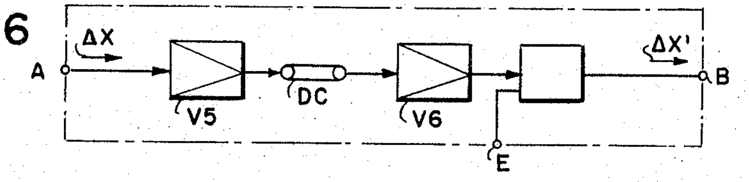
FIG. 17
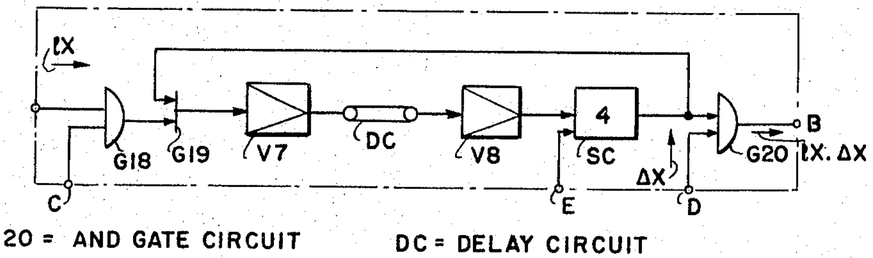
G18, 20 = AND GATE CIRCUIT
G19 = OR GATE CIRCUIT
V7, V8 = AMPLIFIER CIRCUIT
DC = DELAY CIRCUIT
SC = SYNCHRONIZING CIRCUIT
FIG. 18 FIG. 14
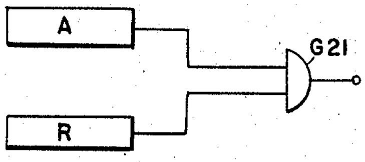
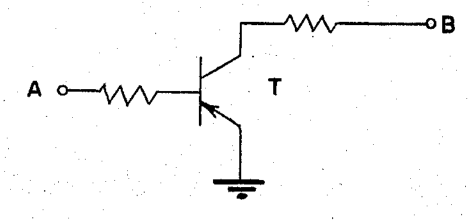
A = ACCUMULATOR CIRCUIT
R = REGISTER CIRCUIT
G21 = AND GATE CIRCUIT 3,325,630

NUMERICAL CONTROL PULSE DISTRIBUTION SYSTEM

Hisato Murakami, Tokyo, Japan, assignor to Fuji Tsushinki Seizo Kabushiki Kaisha, Kawasaki, Japan, a corporation of Japan Filed May 20, 1960, Ser. No. 30,479

Claims priority, application Japan, May 23, 1959, 34/16,702

5 Claims. (Cl. 235—61.6)

This invention is directed toward obtaining control pulses distributed among the components in the direction of a prescribed coordinate axis so that an arbitrary line or curve, including a straight line lying on a plane or in space, may be traced with a prescribed accuracy. It particularly relates to a numerical-control pulse distribution system employed for numerical control of machine tools, for instance milling machines. The so-called line distribution system has been employed widely for the purpose of obtaining the control pulses conducting or governing the numerical control of machine tools and other industrial operations.

A discussion of machining from recorded information (and a bibliography of publications thereon) is found in the text edited by B. K. Ledgerwood, Control Engineering Manual, McGraw-Hill, 1957 (VFG 1957), particularly pages 10 and 11, as follows:

In recorded-information numerical control of machine tools, the cutting tool traverses a programmed or predetermined path in response to numerical intelligence recorded in a permanent storage system. All these systems require position intelligence, while those designed for multiple-dimension profiling require also coordinate-related rate intelligence. The chronological steps in data preparation are to:

(1) Tabulate the coordinates of the defined profile or surface from the working drawing of the part to be machined.

(2) Compute the coordinates of the center-line locus of a suitable radius cutter, so that the cutter will be tangent to the desired profile at each tabulated data point.

(3) Compute intermediate data points along this locus, as required by the profile geometry or the interpolation order of the data system.

At some point following step 1, the control intelligence is recorded on a permanent-storage medium such as a physical template, punched cards, punched tape, or magnetic tape.

The Ledgerwood text discusses two types of systems involving manual and automatic operations, and a system C that is completely automatic.

On page 11 of said Ledgerwood text is a list of references including the following:

A Numerically Controlled Milling Machine, Servomechanisms Laboratory, Massachusetts Institute of Technology, Report to Air Force on Contract AF 33(038)-24007;

A Numerically Controlled Machine Tool System Operating From Coded Punched-Tape, H. W. Mergler, Doctoral Thesis, Case Institute of Technology, 1956.

Another discussion of numerical contouring systems is found in Industrial Electronics Handbook, W. D. Cockrell, 1st Edition, McGraw-Hill Book Co., 1958, pages 5–155 to 5–166. A bibliography is found on pages 5–165, 166. That text states that the stored information on magnetic tape has taken two forms—pulses or digital, and phase or analogue. For the pulse-counting method, optical gratings, shaft digitizers and other forms of pulse-generating instruments are used. A block diagram of a typical pulse-counting system is shown on page 5–157. Several machines are described in reports listed in the bibliography.

With pulse-counting systems the information is a series of pulses whose number and polarity per unit length of tape or channel selection vary with the machine speed and direction desired.

Basically, the pulse-counting system uses computer techniques such as summing registers, decoders, and storage elements. The magnetized sections on the tape are in the form of pulses and are compared against the position pulses sent back as a result of machine motion. This results in an output which controls machine and tool motion in a prescribed manner.

A final report of the M.I.T. machine was published in 1952.

Numerical control of milling machines is also described in Control Engineering, March 1960, p. 140–143, and also in the November 1959, February 1958, and May 1960 issues.

These prior art machines are incorporated herein by reference, and reservation is made of right to introduce the same into this disclosure, should it be found expedient.

In order that the present invention may be readily carried into effect, it will now be described with reference to the accompanying drawings, wherein:

FIG. 14 is a diagram of an embodiment of an inversion circuit arrangement which may be utilized as the inversion circuit NOT 1, 2, 3 or 4 of FIG. 13;

FIG. 15 is a block diagram of an embodiment of a multiplying circuit arrangement which may be utilized as the multiplier D$x$, E$x$ or E$y$ of FIG. 6;

FIG. 16 is a block diagram of another embodiment of a multiplying circuit arrangement which may be utilized as the multiplier Dy of FIG. 6;

FIG. 17 is a block diagram of another embodiment of a register circuit arrangement which may be utilized as the register of FIG. 9; and FIG. 18 is a block diagram of an embodiment of a comparator circuit arrangement which may be utilized with the system of the present invention.

FIG. 1 shows one example of the method of tracing a curve by use of the usual line distribution system.

In order to trace the curve $P_0P_{10}$ by the system mentioned above, first the curve $P_0P_{10}$ is subdivided, then the subdivided individual curved segments $\overline{P_0P_1}$, $\overline{P_1P_2}$, $\overline{P_2P_3}$ are approximated by the line segments $\overline{P_0P_1}$, $\overline{P_1P_2}$, $\overline{P_2P_3}$, respectively, and the approximated curve is drawn by connecting these line segments successively. Thus the given curve $P_0P_{10}$ can be traced approximately by tracing this approximated curve.

If the accuracy of approximation is to be enhanced in such system, it is necessary to subdivide the curve at extremely short intervals and to obtain the coordinates of a great many points. As a consequence, many hours of labor are expanded in constructing or obtaining the data, and the calculation of the coordinates and the resulting data become very complicated. Furthermore, in order to trace a given curve at a uniform speed within a prescribed time interval the approximated line segments become extremely short, therefore, the rapidly varying new data should be read into the line distributor one after another at a high speed in order to effect continuously the pulse distribution of the curve.

According to the present invention, an advantageous numerical control pulse distribution system free from the defects mentioned above can be obtained by the following expendients: A prescribed numerical value is added to the initial value in succession, and, when the numerical value obtained as the result of the operation gives rise to the upward shift of the figure or curve of FIG. 1, the output pulse is picked up corresponding to the frequencies of the figure shift, and then the control pulse is produced by this output pulse.

Figure 2:
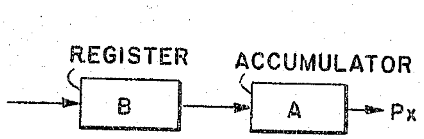
FIG. 2 is a block diagram of an embodiment of an arrangement illustrating the fundamental principle of the pulse distribution system of the present invention.

FIG. 2 shows by block diagram the fundamental principle of the pulse distribution system related to the present invention.

In FIG. 2, A, B show the accumulator and the register, respectively.

First the initial value $X_0$ is applied to the accumulator A, and the prescribed value $\Delta X$ to the register B. The value $\Delta X$, as will be described later, is a constant or a variable to be varied properly. Then if the pulse ordering the accumulation is given suitably, the numerical value $\Delta X$ that has been given to the register in advance is delivered repeatedly to the accumulator A and is there accumulated over the initial value $X_0$. In case the numerical value accumulated at A brings about the upward shift of the figure, a prescribed number of, for instance one, signal pulse $Px$ is picked up on the output side of the accumulator A by using the figure raising signal. The signal pulse $Px$ thus picked up can be distributed in various ways by the initial value $X_0$ and the added value $\Delta X$. In the present invention, as will be described later, the control pulses distributed by the method of circular or line distribution can be obtained by constructing the control pulse from this signal pulse. According to the present invention, as will be explained later, the control pulses distributed by a curve such as a circular arc other than a straight line can be obtained easily. This is especially advantageous for the numerical control of machine tools and so on. That is, most of the curves drawn by the cutter track etc. in machine tools are of the type of a geometric drawing, consisting of straight lines and circular arcs. In tracing a given curve, therefore, if it is divided into the parts of straight lines and circular arcs, the control pulses capable of tracing the divided individual segments can easily be obtained by applying the system related to the present invention.

Figures 1, 3:
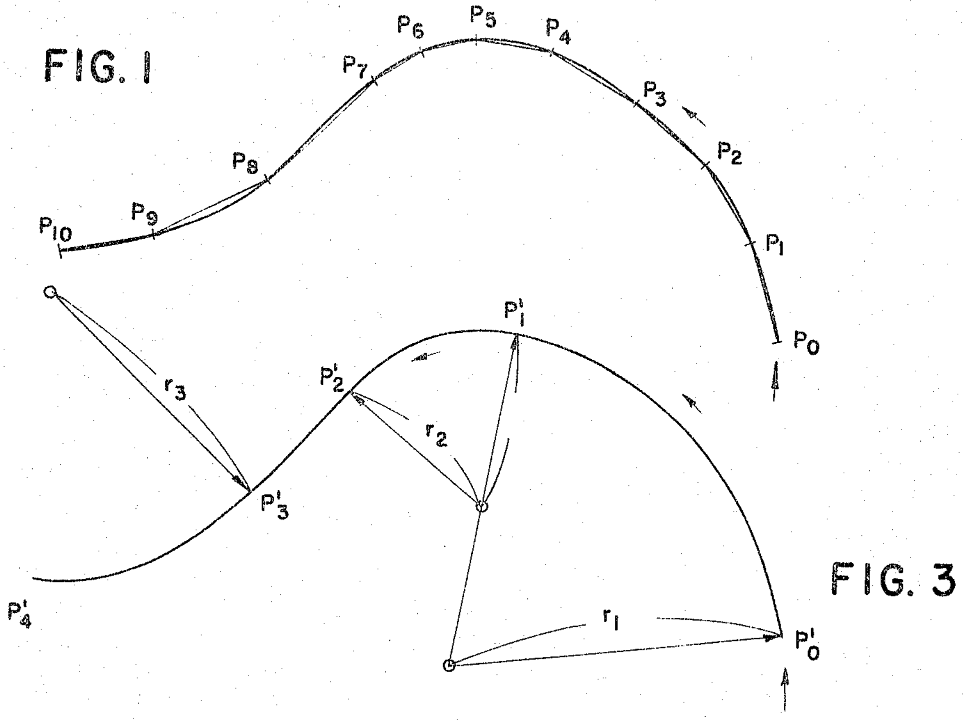
FIG. 1 is a graphical illustration of an embodiment of the method of tracing a curve by use of a usual line distribution system.
FIG. 3 is a graphical illustration of an embodiment of the method of tracing a curve utilizing the system of the present invention.

FIG. 3 shows one example of the method of tracing a given curve by use of the system of the present invention.

According to the present invention, the given curve $P_0'P_4'$ should first be divided into the approximated circular arcs $P_0'P_1'$, $P_1'P_2'$, $P_3'P_4'$ having the radii $r_1$, $r_2$, $r_3$, respectively, and the straight line segment $P_2'P_3'$, then the approximated curve drawn by connecting these arcs and line segment successively is to be traced by the numerical control system.

By thus approximating the given curve by the circular arcs and line the necessary data can be managed with a considerably small amount; as a consequence the calculating labor required in constructing the data can be reduced to the extent of the amount of labor needed in the preparatory calculation for the case of the system applied up to this time.

A detailed description, with reference to the diagram, will be given of the method of dividing a curve into circular arcs by applying the system of the present invention.

Figure 4:
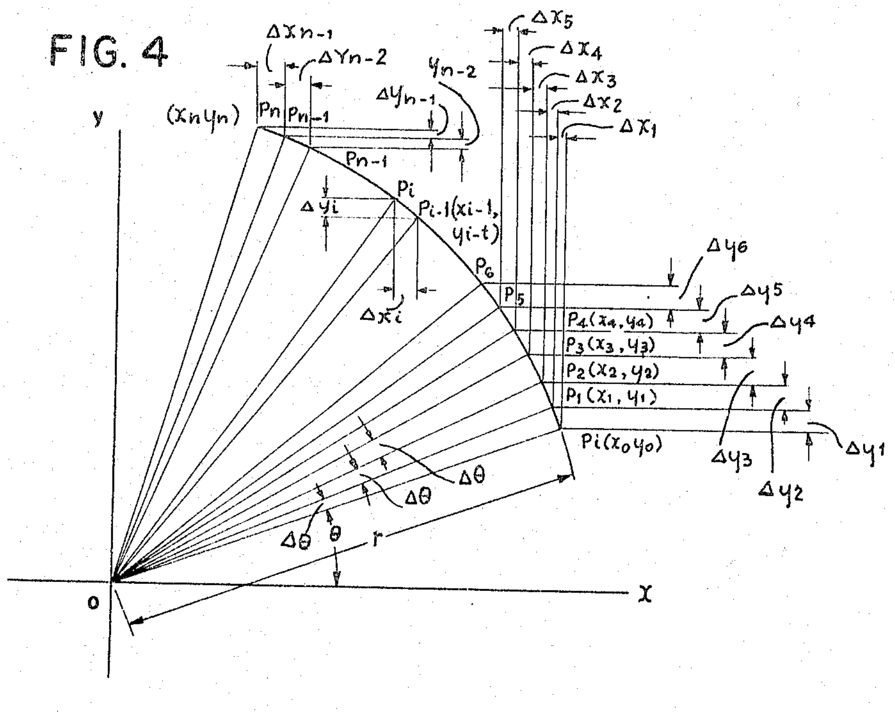
FIG. 4 is a graphical illustration describing the circular arc distribution method of the present invention.
Figure 5:
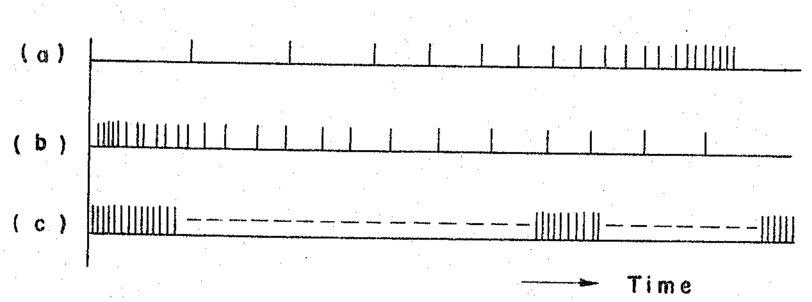
FIG. 5 illustrates the series of control pulses obtained as a result of the circular arc distribution of FIG. 4.

FIG. 4 is a graphical illustration describing the circular art distributions method of the present invention. FIG. 5 illustrates the series of control pulses obtained as a result of the circular arc distribution of FIG. 4.

In FIG. 4 the circular arc $P_0P_n$ shows the track which is drawn when the point located at the coordinate point $P_0(X_0Y_0)$ moves to the coordinate point $P_n(X_nY_n)$ with the origin (0) and ($r$) as the center and the radius of the circle, respectively, and the points $P_1, P_2, P_3 \ldots P_n$ show the coordinate points for the case in which the circular arc $P_0P_n$ is subdivided with the prescribed angle $\Delta\theta$ subtending at the center.

Now, if the point located at $P_0(X_0Y_0)$ has moved to the coordinate point $P_1$, the X- and Y-components of the displacement are denoted by $\Delta X_1$ and $\Delta Y_1$ respectively. Similarly the components of the displacement from the point $P_1$ to $P_2$ are denoted by $\Delta X_2$ and $\Delta Y_2$, and generally those of the displacement from $P_{i-1}$ to $P_i$ by $\Delta X_i$ and $\Delta Y_i$, respectively.

In order to obtain the control pulses by the circular arc distribution, a prescribed number of pulses, for instance a single pulse, should be picked up respectively in the direction of X- and Y-axis when the X-, Y-components $\Delta X$, $\Delta Y$, respectively, of the displacement from the point $P_0$ have reached a unit length.

$\Delta X$ and $\Delta Y$ are expressed respectively as $$\Delta X=\sum_{i=1}^{n}\Delta X_i \tag{1}$$

$$\Delta Y=\sum_{i=1}^{n}\Delta Y_i \tag{2}$$

Calculating $\Delta x_1$ and $\Delta y_1$ by use of the diagram, we obtain $$\begin{aligned}\Delta X_1 &= X_1-X_0\\ &=\gamma\{\cos(\theta+\Delta\theta)-\cos\theta\}\\ &=\gamma\left\{\cos\left(-\frac{\Delta\theta^2}{2!}+\frac{\Delta\theta^4}{4!}\cdots\right)-\sin\left(\Delta\theta-\frac{\Delta\theta^3}{3!}+\cdots\right)\right\}\\ &=-Y_0\Delta\theta-X_0\frac{\Delta\theta^2}{2!}+Y_0\frac{\Delta\theta^3}{3!}+X_0\frac{\Delta\theta^4}{4!}\cdots\end{aligned}$$

Similiarly, $$\Delta Y_1=X_0\Delta\theta-Y_0\frac{\Delta\theta^2}{2!}-X_0\frac{\Delta\theta^3}{3!}+Y_0\frac{\Delta\theta^4}{4!}+\cdots$$

The coordinates of the point $P_1(X_1, Y_1)$ are obtained with $P_0$ ($X_0$, $Y_0$) as the reference point as follows:

$$X_1=X_0+\Delta_{X_1}$$

$$Y_1=Y_0+\Delta_{X_1}$$

Repeating the similar procedure, the components $\Delta x_i$ and $\Delta y_i$ in the direction of X- and Y-axis, respectively, of the displacement from $$P_{i-1}(\underline{\underline{X_{i-1}}}, \underline{\underline{Y_{i-1}}}) \text{ to } P_i(\underline{\underline{X_i}}, \underline{\underline{Y_i}})$$

are obtained as Formulae 3, 4:

$$\Delta X_i = -Y_{i-1}\Delta\theta - X_{i-1}\frac{\Delta\theta^2}{2!} + Y_{i-1}\frac{\Delta\theta^3}{3!} + X_{i-1}\frac{\Delta\theta^4}{4!} - \tag{3}$$

$$\Delta Y_i = X_{i-1}\Delta\theta - Y_{i-1}\frac{\Delta\theta^2}{2!} - X_{i-1}\frac{\Delta\theta^3}{3!} + Y_{i-1}\frac{\Delta\theta^4}{4!} + \tag{4}$$

Thus $\Delta x$ and $\Delta y$ can easily be calculated by the digital computer from the Formulae 1, 2, 3, 4, and by using the figure raising signal in the computer the signal pulse can be picked up easily whenever the magnitudes of $\Delta x$ and $\Delta y$ reach the unit length.

How many terms are adopted in the calculation of 3 and 4 depends upon the extent of the accuracy of approximation and of the choice of $\Delta\theta$.

In FIG. 5, *a*, *b* show, with abscissa as the time axis, the series of control pulses thus obtained by the circular arc distribution, and *c* shows the series of the accumulation directing pulses.

Figure 6:
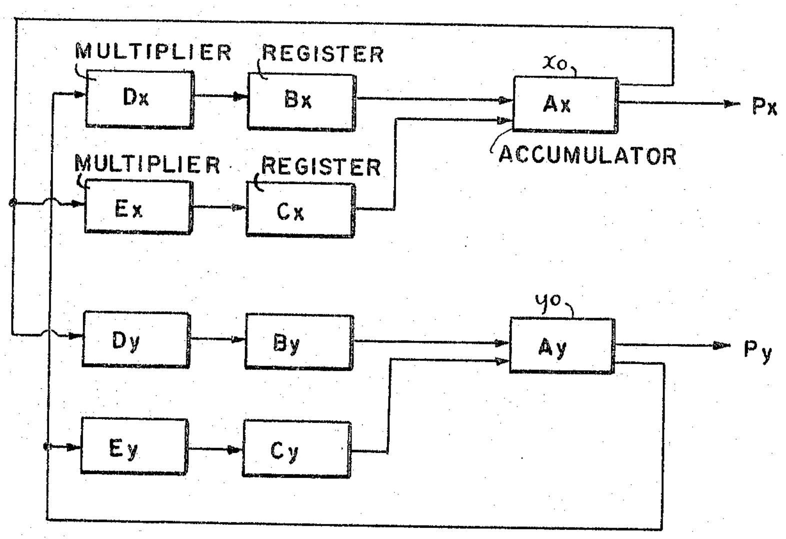
FIG. 6 is a block diagram of an embodiment of a circuit arrangement for applying the present invention for the circular arc distribution along a curve lying in a plane.

FIG. 6 is a block diagram of a circuit arrangement for applying the present invention for the circular arc distribution along a curve lying in a plane. In this figure, AX, AY are the accumulators, DX, DY; EX, EY the constant multiplying circuits to conduct the operation of the first and second terms, respectively, of the Formulae 3 and 4 and BX, BY; CX, CY, are the registers to transfer the results of the operation at DX, DY; and EX, EY, respectively. The registers BX, BY; CX, CY correspond to the register B in FIG. 2. In the practical example of FIG. 6 the 3rd and the succeeding terms in the Formulae 3 and 4 have been omitted as the orders within limits of error.

The calculation of the Formulae 1, 2; 3, 4 will be conducted as follows:

In the first place give the initial values $x_0$ and $y_0$ to the accumulators AX and AY, respectively. Then multiply the initial values $X_0$ and $Y_0$ by $\Delta\theta$ in the multiplying circuits DX and DY, and transfer the resulting products $x_0\Delta\theta$ and $y_0\Delta\theta$ respectively to the registers BX and BY. On the other hand multiply the initial values $x_0$ and $y_0$ by $\Delta\theta^2$ in the multiplying circuits EX and EY, respectively, and transfer the resulting products $x_0\Delta\theta^2$ and $y_0\Delta\theta^2$ respectively to the registers CX and CY. After that add the values of the registers BX, BY; CX, CY to the initial values $x_0$, $y_0$ of the accumulators AX, AY, respectively, by the accumulation directing pulses as have been shown as *c* in FIG. 5. In this case, as can be seen in the Formulae 3 and 4, the 2nd term has factor ½, therefore the values of the registers CX, CY should be controlled in such a way that they may be added once whenever the values of the registers BX, BY are added twice to the accumulators AX and AY.

In general, in the registers BX, BY, CX and CY the following values are in existence, respectively, and these values are the variables corresponding to the values $\Delta X$ that has been given to the register B in FIG. 2.

value of $BX = Y_i - 1\Delta\theta$
value of $BY = X_i - 1\Delta\theta$
value of $CX = X_i - 1\Delta\theta^2$
value of $CY = Y_i - 1\Delta\theta^2$ If such operations are repeated, *x*, *y* in the Formulae 1, 2 are accumulated successively over the initial values $x_0$, $y_0$, respectively, in the accumulators AX and AY, and the numerical values of which are given as follows:

$$\text{Numerical values of } AX = X_0 + \sum_{i=1}^{n} \Delta X_i \tag{5}$$

$$\text{Numerical value of } AY = Y_0 + \sum_{i=1} \Delta X_i \tag{6}$$

Consequently, if the figure raising signals PX, PY for the accumulators AX, AY are picked up, the control pulses by the circular arc distribution mentioned above can be obtained.

It is recommended to choose $\Delta\theta = 10^{-n}$, where *n* is a natural number, in order to facilitate the calculation.

If $\Delta x_i$ and $\Delta y_i$ are chosen smaller than 1, that is, if $\Delta\theta$ is chosen to satisfy the following equations:

$$\Delta X_i = F(\Delta\theta) < 1$$
$$\Delta Y_i = F(\Delta\theta) < 1$$

the figure raising signal mentioned above is given as the change of the integral part.

In order to stop the tracing of the curve $P_0P_n$ at the point $P_n$, the coordinates ($P_n$) ($x_n$, $y_n$) of which should be obtained in advance, the comparison values ($x_0+\Delta x$), ($x_n$); ($y_0+\Delta y$), ($y_n$), respectively, and at the accumulator, stop the accumulation directing pulse as the following relations are satisfied.

$$|(Y_0+\Delta Y)-Y_n|<1$$
$$|(X_0+\Delta Y)-X_n|<1$$

In this case, if $$|(x_0+\Delta x)-x_n|<1 \text{ and } |(y_0+\Delta y)-y_n|>1, \text{ or}$$
$$|(x_0+\Delta x)-x_n|>1 \text{ and } |(y_0+\Delta y)-y_n|<1,$$

the errors can be corrected by sending the correcting pulse to the accumulator AX or AY.

A description will now be given of the method of tracing a straight line by the system of the present invention.

Figure 7:
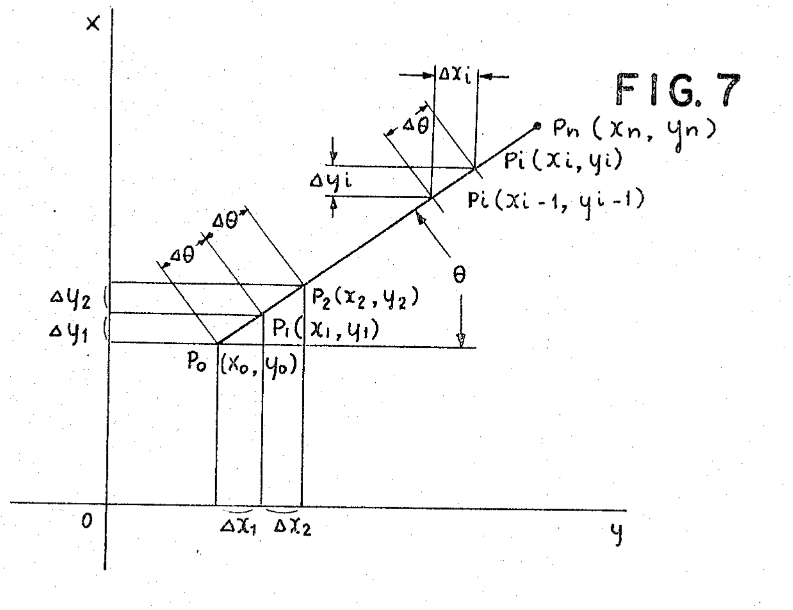
FIG. 7 is a graphical illustration describing the line distribution method of the present invention.
Figure 8:
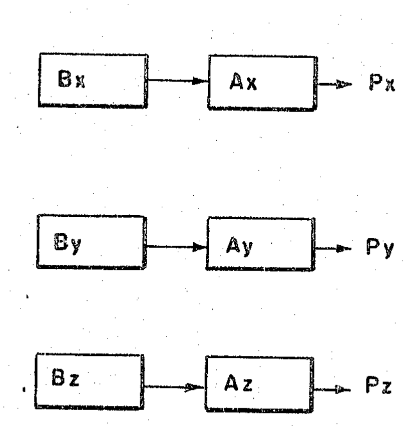
FIG. 8 is a block diagram of an embodiment of a circuit arrangement for applying the present invention for the straight line distribution along a straight line lying in three dimensions.

FIG. 7 is a graphical illustration describing the line distribution method of the present invention. FIG. 8 is a block diagram of an embodiment of a circuit arrangement for applying the distribution system for a straight line lying in three dimensions.

In FIG. 7, when a point moves from the point $P_0$ to $P_n$ along the line $P_0P_n$, the components $\Delta x$, $\Delta y$ of the displacement in the X-, Y-axis, respectively, can be expressed quite similarly to the Formulae 1, 2, i.e., $$\Delta X = \sum_{i=1}^{n} \Delta X_i$$

$$\Delta Y = \sum_{i=1}^{n} \Delta Y_i \tag{2}$$

Then by calculating $\Delta x_i$ and $\Delta y_i$ from the diagram, we obtain $$\Delta X_i = \Delta\theta \cdot \tan\theta = \Delta\theta \cdot \left(\frac{X_n - X_0}{Y_n - Y_0}\right) = \alpha \cdot \Delta\theta \tag{7}$$

$$\Delta Y_i = \Delta\theta \cdot \cot\theta = \Delta\theta \cdot \left(\frac{Y_n - Y_0}{X_n - X_0}\right) = \beta \cdot \Delta 9 \tag{8}$$

where $$\alpha = \frac{X_n - X_0}{Y_n - Y_0}$$

$$\beta = \frac{Y_n - Y_0}{X_n - X_0}$$

$\Delta x_1$, $\Delta y_1$ are constants, and their numerical values can be obtained immediately by calculation if the coordinates of the points $P_0$, $P_n$, and $\Delta\theta$ are given.

Consequently, the values of $\Delta x$ and $\Delta y$ can easily be calculated by a digital computer. By using the figure raising signal of the digital computer the control pulses for the line distribution can be easily obtained.

In FIG. 8, AX, AY, AZ show respectively the accumulator corresponding to A in FIG. 2, and pick up the figure raising signal $Px$, $Py$, $Pz$. respectively, at the respective output sides. BX, BY, BZ are the registers corresponding to the register B in FIG. 2, and are given the constants $\Delta x_1=\alpha\Delta\theta$, $\Delta y_1=\beta\Delta\theta$, $\Delta z_1\gamma\Delta\theta$, respectively, obtained as in the Formulae 7, 8. The constants $\Delta X_1$, $\Delta Y_1$ correspond to the numerical value $\Delta x$ given to $b$ in FIG. 2, being the constant in this case.

The initial values $x_0$, $y_0$, $z_0$ are given to the accumulators AX, AY, AZ, respectively.

Thus, if the constants $\Delta x_1$, $\Delta y_1$, $\Delta z_1$ of the registers $Bx$, $By$, $Bz$ are added to the accumulators AX, AY, AZ, respectively, by sending the accumulation directing pulses as have been shown in FIG. 5(c), the numerical values $\Delta x$, $\Delta y$, $\Delta z$ corresponding to the Formulae 1, 2 are accumulated at the accumulators AX, AY, AZ, respectively. As a consequence, by picking up the figure raising signal the control pulses for tracing the line $P_0P_n$ can be obtained.

Figure 9:
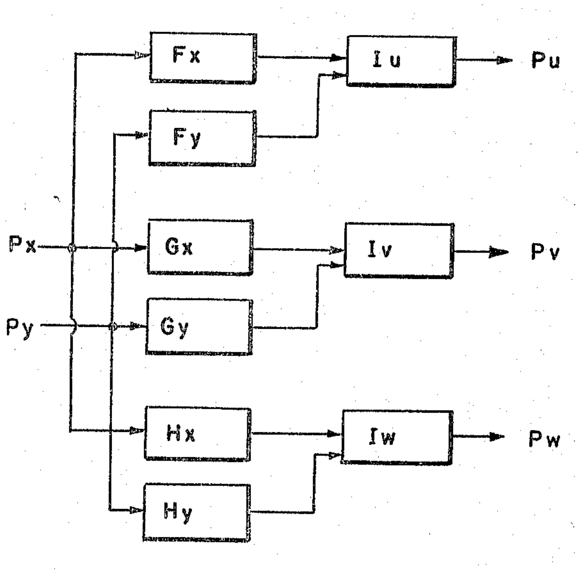
FIG. 9 is a block diagram of an embodiment of a circuit arrangement for the method of the present invention of distribution in three dimensions of the control pulses distributed in two dimensions in a plane.

The curve divided into circular arcs as in FIGS. 5 and 6 may readily be further redistributed in three dimensions. FIG. 9 is a block diagram of embodiment of the method of the present invention of distribution in three dimensions of the control pulses distributed in two dimensions in a plane.

Now, let the direction cosines of the angles made by X-, Y-axis on the plane locating circular arc and $u$-, V-, and W-axis be as follows:

direction cosine of the angle made by X-axis and $u$-axis $lx$
direction cosine of the angle made by X-axis and $v$-axis $mx$
direction cosine of the angle made by X-axis and $w$-axis $nx$
direction cosine of the angle made by Y-axis and $u$-axis $ly$
direction cosine of the angle made by Y-axis and $v$-axis $my$
direction cosine of the angle made by Y-axis and $w$-axis $ny$ By multiplying the control pulse $Px$, $Py$ distributed in the X-, Y-axis, for example, by the above-mentioned direction cosines $lx$, $ly$, respectively, and adding together the resulting products, the component $Pu$ in the direction of $u$-axis for the control pulses $Px$, $Py$ can be obtained.

Similarly, the components $Pv$, $Pw$, in the directions of V-, W-axis for the control pulse $Px$, $Py$, respectively, can be obtained and so the control pulses $Px$, $Py$ can be redistributed in the three dimensions.

In FIG. 9, $Fx$, $Fy$; $Gx$, $Gy$: $Hx$, $Hy$ are the registers to multiply respectively the pulses $Px$, $Py$ by the direction cosines $x$, $y$; $mx$, $my$; $nx$, $ny$; $Xu$, $Xv$, XW being respectively the accumulators adding these resulting products.

Up to this place, the system of the present invention has been described in detail for the cases of line and circular distribution.

However, the system is not limited to the cases of line and circular distribution, but, according to the choice of the quality of the number accumulated repeatedly over the initial value in FIG. 2, the distribution by various curves, such as hyperbola, parabola, etc., can also be effected. Moreover, the distribution by a spiral is made possible by the combination of the circular arc distribution system in FIG. 6 and the line distribution system in FIG. 9.

Figure 10:
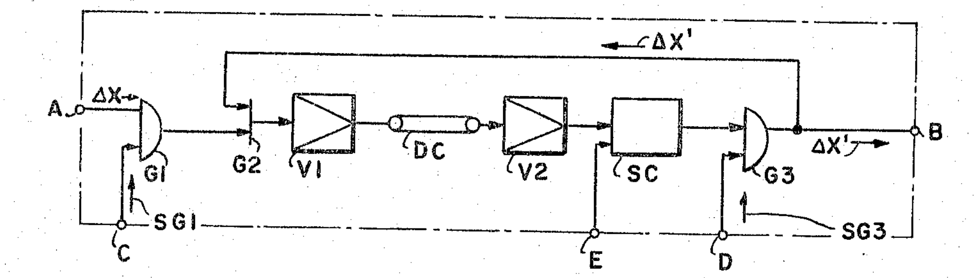
FIG. 10 is a block diagram of an embodiment of a register circuit arrangement which may be utilized as the register of FIGS. 2, 6, 8, 9 and 18.

An example of the register indicated by block B in FIG. 2 is illustrated in FIG. 10. This register can be used for the register BX, BY, in FIG. 6 BX, BY, BZ in FIG. 8 and FX, FY, GX, GY, HX, HY in FIG. 9.

A prescribed value ΔX is given to the register as follows:

At first, a gate control signal SG1 is supplied to the terminal C, and the value ΔX to the terminal A. The gate circuit G1 is turned to "on" by the signal SG1 for a fixed moment, and the value ΔX is supplied to the gate circuit G2. While the synchronizing signal SP is supplied to the terminal E and a gate control signal SG3 to the terminal D, the gate circuit G3 is turned to "on" by the signal SG3.

The value ΔX is circulated through the following route:

$$(G2) \rightarrow (VI) \rightarrow (DC) \rightarrow (V2) \rightarrow (SC) \rightarrow (G3) \rightarrow \text{feedback line} \rightarrow (G2)$$

The value ΔX is delayed for a predetermined period of time in the delay circuit DC and synchronized to the signal SP in synchronizating circuit SC. Thus the value ΔX is circulated in the said route at a fixed interval, and an output signal ΔX' is sent off to the output terminal B at the same interval, which is almost decided by the time constant of the delay circuit DC. The value ΔX memorized and circulated in the said register vanishes, when the signal SG3 is cut off and the gate circuit G3 returns to "off."

The gate circuits G1, G2, G3 consist of the well-known circuits, that is, the so-called "And gate circuit" or "Or gate circuit." The delay circuit DC is a "nickel delay circuit" a "mercury delay circuit," or other known devices of this type.

Figure 12:
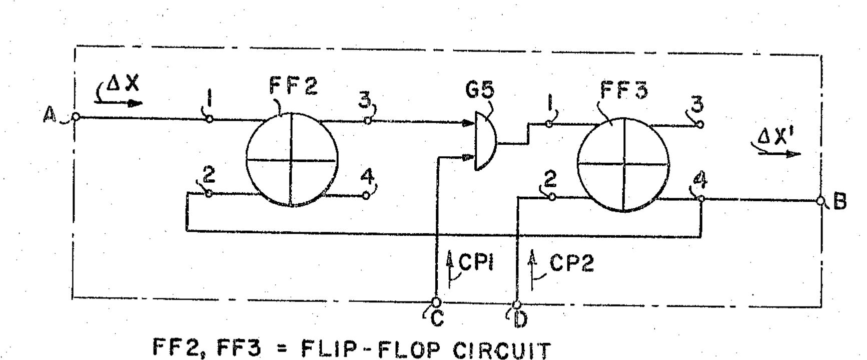
FIG. 12 is a block diagram of an embodiment of a synchronizing circuit arrangement which may be utilized as the synchronizing circuit SC of FIGS. 10, 11, 15, 16 and 17.

An example of the synchronizing circuit SC is illustrated in FIG. 12.

In FIG. 12, the blocks FF2 and FF3 comprise the well-known "flip-flop circuit." The block G5 is an "And gate circuit." The terminal A is supplied with an input signal ΔX, and the terminals C and D are supplied with clocked pulses CP1 and CP2.

When an input signal ΔX is applied, the flip-flop circuit FF2 is inverted and the higher voltage appears at the terminal 3 of the circuit FF1. The gate circuit G5 is turned to "on" by this voltage. Then the clocked pulse CP1 is supplied to the terminal 1 of the circuit FF3, which is inverted by the said pulse CP1. Then the clocked pulse CP2 is supplied to the terminal 2 of the circuit FF3, which is returned to the original state by the said pulse CP2. When the circuit FF3 is returned, the output signal ΔX', synchronized to the clocked pulse CP2, is sent off to the output terminal B. The signal ΔX' is fed back to the terminal 2 of the circuit FF2, which is returned to the original state. Thus the input signal ΔX is converted to the output signal ΔX', synchronized to the clocked pulse CP2.

Figure 11:
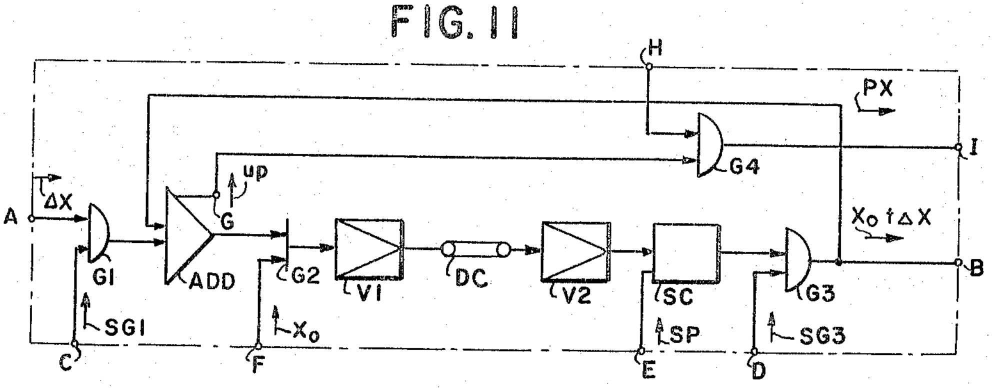
FIG. 11 is a block diagram of an embodiment of an accumulator circuit arrangement which may be utilized as the accumulator circuit of FIGS. 2, 6, 8, 9 and 18.

In FIG. 11, an example of the accumulator circuit shown by the block A in FIG. 2 is illustrated. This circuit can be used for the block AX, AY in FIG. 6, AX, AY, AZ in FIG. 8 and IU, IV, IW in FIG. 9.

The accumulator circuit of FIG. 11 is similar to the register of FIG. 10, at their important portions. But an adding circuit (Add) is included in this accumulator circuit and figure raising signals are picked up from the said adding circuit.

In FIG. 11, an initial value X0 is at first applied through the input terminal F and the said value X0 is circulated through the route as follows:

$$(G2) \rightarrow (VI) \rightarrow (DC) \rightarrow (V2) \rightarrow (SC) \rightarrow (G3) \rightarrow \text{feedback line} \rightarrow (\text{Add}) \rightarrow (G2)$$

On the other hand, the gate control signal SG1 is supplied to the terminal C, and input signal, ΔX, to the terminal A. The signal ΔX is added to the initial value X0 at the adding circuit (Add), and the sum of the signal ΔX and value X0 is circulated through the said route for the value X0. Then the sum $(X0+\Delta X)$ is sent off to the output terminal B, and the figure raising signal UP to the terminal G. The specified signal of the signals UP is sent off as the output signal PX to the terminal I through the gate circuit G4.

Figure 13:
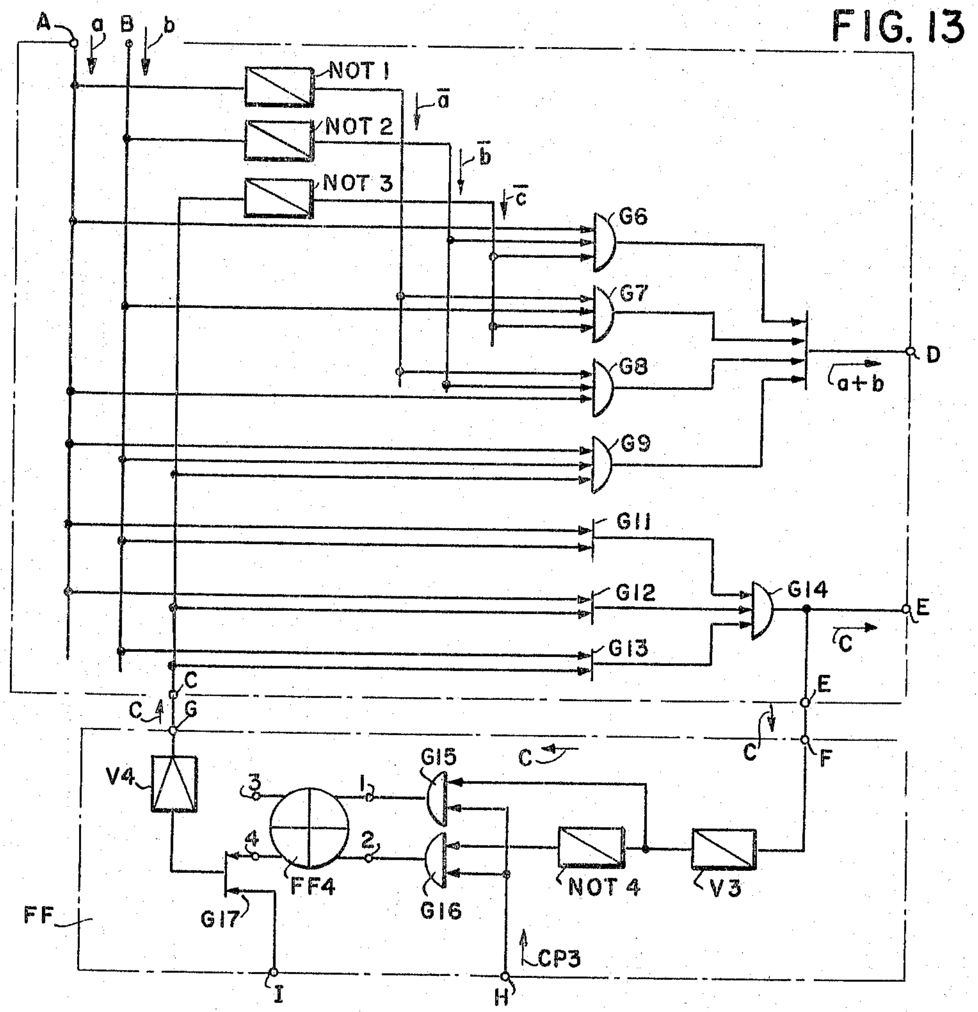
FIG. 13 is a block diagram of an embodiment of an adding circuit arrangement which may be utilized as the adding circuit ADD of FIG. 11.

FIG. 13 illustrates an example of the adding circuit (Add).

In FIG. 13, blocks (Not 1) . . . (Not 3) are well-known inversion circuits, in which input signals *a*, *b*, *c* are inverted to the inverse signal $\bar{a}$, $\bar{b}$, $\bar{c}$; for example, if an input signal *a* is (1) or (0), the inverse signal $\bar{a}$ is (0) or (1). See Control Engineering, May 1960, pp. 101–104, and the references therein, for an explanation of Not logic elements.

Now, if an input signal *a* is supplied to the terminal A, and signal *b* to the terminal B, the sum of two signals *a* and *b* is sent off to the output terminal D and E, as follows:

When both of the signals *a* and *b* are (0) and the figure raised signal *c* is (0), both of the output signals at the terminals D and E are (0). When one of the signals *a*, *b*, and *c*, for example only *a*, is (1) and the others are (0), a signal (1) is supplied to the terminal D through the gate circuits G6 and G10, while a signal (0) is supplied to the terminal E. If two of the signals are (1) and another is (0), for example, only the signal C is (0), a signal (0) is supplied to the terminal D, and a figure raising signal (1) is supplied to the terminal E. If all of the signals *a*, *b*, and *c* are (1), a signal (1) is sent off to both of the terminals D and E.

The figure raising signal *c* is given to the feedback circuit FF, too, and fed back to the terminal *c*. When a signal (1) is picked up, it is supplied to the gate circuit G15, which turns "on." Then a clocked pulse CP3 is supplied to the terminal 1 of the flip-flop circuit FF4 through the circuit G15, and the circuit G15 is inverted by the said pulse CP3. At that time an output signal (1) appears at the terminal 4 of the circuit FF4. The said output signal (1) is supplied to the terminal G through the gate circuit G17 and continues until the circuit FF4 returns to the original state. On the other hand, when a signal (0) is supplied to the terminal F, i.e. no figure raising signal is picked up, a signal (1) is supplied to the gate circuit G16, which turns "on." Then a clocked pulse CP3 is supplied to the terminal 2 of the circuit FF4 and the circuit FF4 is returned to the original state.

In this way, figure raising signal C is fed back to the input terminal C and the said signal C is added to the input signals *a* and *b*. Thus, on one hand, the sum of two signals *a* and *b* is sent off as the output signal to the terminal D, and, on the other hand, figure raising signals *c* are sent to the terminal E.

FIG. 14 shows the most simple type of transistor inversion circuit.

Referring to FIG. 14, when an input signal (1) or (0) is supplied to the input terminal A, an output signal (0) or (1), inverted by the transistor T, is picked up at the output terminal B.

FIG. 15 is a block diagram of an embodiment of a constant multiplying circuit shown in FIG. 6 by the block DX, EX, and EY. FIG. 16 is a block diagram of an embodiment of the other multiplying circuit shown as DY in FIG. 6. The circuits of FIGS. 15 and 16 are different from each other in that FIG. 15 includes an inversion circuit (Not 5) and FIG. 16 does not.

With reference to FIG. 16, when an input signal ΔX is supplied to the terminal A, an output signal ΔX′, delayed for a fixed amount by the delay circuit DC, is sent off to the terminal B.

The input signal ΔX is a binary numeral which consists of signal (1) or (0). Therefore, on the one hand, when a signal (1) is supplied to the terminal A, an output signal (1) is acquired; on the other hand, when a signal (0) or no signal is given, an output signal (0) is acquired. Therefore, the relationship of signals ΔX and ΔX′ is shown by the following example:

$$\text{Value of } \Delta X = 10110$$
$$\text{Value of } \Delta X' = 01011.0$$

In this example, however, the delay moment of signal ΔX in delay circuit DC is equal to an interval of pulses. In this way, by means of the circuit of FIG. 16, there can be acquired the desired signal, which is multiplied by an optional binary numeral.

The circuit in FIG. 15 includes an inversion circuit (Not 5). An output signal $\Delta\bar{X}'$ which is the complement of the said signal ΔX′, is supplied to the output terminal B. For example:

$$\text{Value of } \Delta X = 10110$$
$$\text{Value of } \Delta X' = 01011.0$$
$$\text{Value of } \Delta\bar{X}' = 10100.1$$

These inversions of signals take place at the circuit (Not 5).

FIG 17 is another embodiment of a register circuit, indicated by the block FX, FY, GX, GY, HX, HY of FIG. 9. The register circuit of FIG. 17 is quite similar to the register circuit of FIG. 10.

A direction cosine of the angle, for example of value *l*X, is applied through the terminal A, and is circulated through the following route:

$$(G19)\rightarrow(V7)\rightarrow(DC)\rightarrow(V8)\rightarrow(SC)\rightarrow\text{feedback line}\rightarrow(G19)$$

This is while an input signal ΔX is applied through the terminal D for the gate control signal, by which the gate circuit G20 is controlled. In practice, an input signal ΔX is (1) or (0). Therefore, when the signal ΔX is (1), the gate circuit G20 becomes "on" for a fixed moment and a value *l*X is sent off to the terminal B. However, when the signal ΔX is (0), the circuit G20 is kept off. Therefore, each time an input signal is provided, a memorized value *l*X and an input signal ΔX are provided at the terminal B.

An example of an "And gate circuit" is shown in FIG. 1 of the United States Patent No. 2,781,968, and an "Or gate circuit," in FIG. 2. An example of a "flip-flop circuit is shown in FIG. 1 of United States Patent No. 2,715,-997, and a "delay circuit" in FIG. 4 thereof.

In FIG. 6, the output signal of the register CX and CY is added once whenever the output signal of the register BX and BY is added twice to the accumulator AX and AY. This control is achieved by appropriate selection of the time constant of the delay circuit.

The value of the output signal $(X0+\Delta X)$ or $$(Y0+\Delta Y)$$

in the accumulator AX or AY is compared with the predetermined value $X_n$ or $Y_n$ by the circuit of FIG. 18.

Referring to FIG. 18, A is an accumulator circuit and R is a register circuit. For the register circuit R a register circuit as shown in FIG. 10 can be used. In this circuit R has a predetermined value; for example, the value $X_n$ is memorized. Both values $(X_0+\Delta X)$ and $(X_n)$ are compared as follows. When the value $(X_0+\Delta X)$ is equal to value $(X_n)$, a pre-decided signal is picked up from the gate circuit G21. Therefore, one can confirm by reference to this output signal that the value $(X_0+\Delta X)$ has come up to the value $(X_n)$.

This confirmation is achieved in the other ways. For example, the value $(\bar{X}u)$ can be the complement of value $(Xu)$.

The descriptions of the basic system for numerical control of machine operations which I have improved are found for example in following literatures:

J. O. McDonough, "Punched Tape Guides Milling Machine Cutters," in American magazine "Electronics" 26, No. 4, pp. 135–137, 1953.

D. T. N. Williams, "Automatic Control of Machine Tools," in English magazine "Machinery" 84 (No. 2168) 1954, 06.

I claim:

1. A numerical pulse distribution system for causing a milling machine component to follow a determined path relative to a coordinate system by distributing pulses recorded on a storage medium in accordance with arcuate and linear segments of said determined path to components moving said milling machine component in the directions of respective coordinate axes, comprising digital accumulator means having for each segment of said determined path an initial value set therein corresponding to the initial coordinate position of each segment upon the determined path to be followed, said accumulator means having an input and an output; digital multiplier means having an input connected and responsive to said accumulator means and having set therein a value corresponding to a function of the change in coordinate position between successive points on said determined path, said multiplier means having an output; and register means connecting the output of said multiplier means to the input of said accumulator means, said accumulator means adding the output of said multiplier means to the value in said accumulator means to thereby set the said accumulator means to a new value, said accumulator means producing in its output an output pulse when the change between successive values in the said accumulator means exceeds a predetermined value and producing no output pulse when said change is less than a predetermined value thereby to halt said components moving said milling machine component at the end of each segment of said determined path.

2. In a system as claimed in claim 1, the arcuate segments of said determined path including at least one of a substantially circular configuration, a substantially hyperbolic configuration and a substantially parabolic configuration.

3. A numerical pulse distribution system for causing a device to follow a path relative to a coordinate system by distributing pulses to components moving the device in the directions of respective coordinate axes, comprising a plurality of digital accumulators each corresponding to one of said coordinate axes and each having set therein an initial value corresponding to the initial position on each coordinate of the path to be followed; a group of digital multipliers for each of said accumulators, the number of multipliers in each group of multipliers corresponding to the number of accumulators, each multiplier of each group of multipliers having set therein a value representing a different exponential order of a function of the change in coordinate position between successive points on said path, each accumulator being connected to one multiplier of different exponential order in each group of multipliers, said multipliers multiplying the values in said accumulators with the values set into the multipliers; register means connecting the outputs of each group of multipliers to the input of the corresponding accumulator, each of said accumulators adding to outputs from the corresponding group of multipliers, each of said accumulators including an input and output means for producing a pulse when the sum of the outputs of the corresponding multipliers exceeds a predetermined value to thereby actuate the component corresponding to the axis to which the accumulator corresponds; and feedback means in said accumulators for adding the value in each of said accumulators with the sum of the outputs of the corresponding multipliers to obtain new values in said accumulators corresponding to a new coordinate position.

4. A numerical pulse distribution system for causing a milling machine component to follow a determined path relative to a coordinate system by distributing pulses recorded on a storage medium in accordance with arcuate and linear segments of said determined path to components moving said milling machine component in the directions of respective coordinate axes, comprising digital accumulator means having for each segment of said determined path an initial value set therein corresponding to the initial coordinate position of each segment upon the determined path to be followed, said accumulator means having an input and an output; digital multiplier means having an input connected and responsive to said accumulator means and having set therein a value corresponding to a function of the change in coordinate position between successive points on said determined path, said multiplier means having an output; register means connecting the output of said multiplier means to the input of said accumulator means, said accumulator means adding the output of said multiplier means to the value in said accumulator means to thereby set the said accumulator means to a new value, said accumulator means producing in its output an output pulse when the change between successive values in the said accumulator means exceeds a predetermined value and producing no output pulse when said change is less than a predetermined value thereby to halt said components moving said milling machine component at the end of each segment of said determined path; and feedback means from the output means of said accumulator means to said multiplier means for feeding said new value to said multiplier means.

5. A numerical pulse distribution system for causing a device to follow a path relative to a coordinate system by distributing pulses to components moving the device in the directions of respective coordinate axes, comprising a plurality of digital accumulators each corresponding to one of said coordinate axes and each having set therein an initial value corresponding to the initial position on each coordinate of the path to be followed; a group of digital multipliers for each of said accumulators, the number of multipliers in each group of multipliers corresponding to the number of accumulators, each multiplier of each group of multipliers having set therein a value representing a different exponential order of a function of the change in coordinate position between successive points on said path; feedback means from the output means of each accumulator to one multiplier of different exponential order in each group of multipliers, said multipliers multiplying the values in said accumulators with the values set into the multipliers; register means connecting the outputs of each group of multipliers to the input of the corresponding accumulator, each of said accumulators adding to outputs from the corresponding group of multipliers, each of said accumulators including an input and output means for producing a pulse when the sum of the outputs of the corresponding multipliers exceeds a predetermined value to thereby actuate the component corresponding to the axis to which the accumulator corresponds; and further feedback means in said accumulators for adding the value in each of said accumulators with the sum of the outputs of the corresponding multipliers to obtain new values in said accumulators corresponding to a new coordinate position.

References Cited

UNITED STATES PATENTS

| | | | |
|---|---|---|---|
| 2,875,389 | 2/1959 | Morrill et al. | 235—61.6 X |
| 3,015,806 | 1/1962 | An Wang et al. | 235—151 |
| 3,063,047 | 11/1962 | Steele | 235—61.5 |

MAYNARD R. WILBUR, *Primary Examiner.*

C. D. ANGEL, DARYL W. COOK, MALCOLM A. MORRISON, W. S. POOLE, *Assistant Examiners.*